United States Patent [19]

McCullough

[11] Patent Number: 5,594,434
[45] Date of Patent: Jan. 14, 1997

[54] ANGULAR SENSING SYSTEM

[75] Inventor: Edward D. McCullough, Riverside, Calif.

[73] Assignee: Rockwell International Corporation, Seal Beach, Calif.

[21] Appl. No.: 317,456

[22] Filed: Oct. 4, 1994

[51] Int. Cl.$^6$ ............................................. H03M 1/22
[52] U.S. Cl. .................. 341/13; 341/1; 341/5; 341/15; 901/2; 901/15; 318/603; 33/534; 33/1 PT; 356/138; 250/231.13
[58] Field of Search ............................ 341/1, 5, 4, 13, 341/111, 15; 33/1 PT, 534, 471; 73/862.31, 862.191; 901/9, 15, 2; 356/138, 150, 153; 250/231.18; 324/160, 161, 174; 318/603

[56] References Cited

U.S. PATENT DOCUMENTS

| | | | |
|---|---|---|---|
| 4,064,504 | 12/1977 | Lepetit et al. | 340/347 |
| 4,221,997 | 9/1980 | Flemming | 318/574 |
| 4,240,069 | 12/1980 | Hullein et al. | 340/347 |
| 4,318,225 | 3/1982 | Jenkinson | 33/1 PT |
| 4,422,065 | 12/1983 | Radomirov et al. | 340/347 |
| 4,562,391 | 12/1985 | Inoue | 318/568 |
| 4,672,279 | 6/1987 | Hosokawa et al. | 318/568 |
| 4,980,839 | 12/1990 | Souji et al. | 364/513 |
| 4,986,724 | 1/1991 | Steinmetz et al. | 414/729 |
| 4,990,767 | 2/1991 | Ernst et al. | 250/231 |
| 5,038,243 | 8/1991 | Gordon | 341/2 |
| 5,068,529 | 11/1991 | Ohno et al. | 250/231.18 |

*Primary Examiner*—Todd Deboer
*Attorney, Agent, or Firm*—George A. Montanye; Harry B. Field; Lawrence N. Ginsberg

[57] ABSTRACT

A rotatable member is positioned coaxial with a joint between a first element and a second element. The joint defines an angle to be measured. The rotatable member has coded information thereon. First and second sensing heads are attached to respective elements. Coded information is arranged on the rotatable member so as to periodically pass in readable proximity to the sensing heads once every revolution of the rotatable member. A decoding system is provided for each sensing head. Each decoding system includes threshold circuitry, a state machine, and a pulse generator for providing a timing strobe. A first timer uses a timing strobe from the first sensing head for continuously determining the average elapsed time for one complete revolution of the rotatable member. A second timer uses timing strobes from the first and second sensing heads to continuously determine the average elapsed time for the coded information on the rotatable member to travel from the first sensing head to the second head. A time-based generator provides the necessary time pulse references to the first and second timers. Ratio determining circuitry calculates the ratio of the average elapsed time of the second timer to the average elapsed time of the first timer. The ratio defines the angle between the first element as a fraction of a revolution.

11 Claims, 4 Drawing Sheets

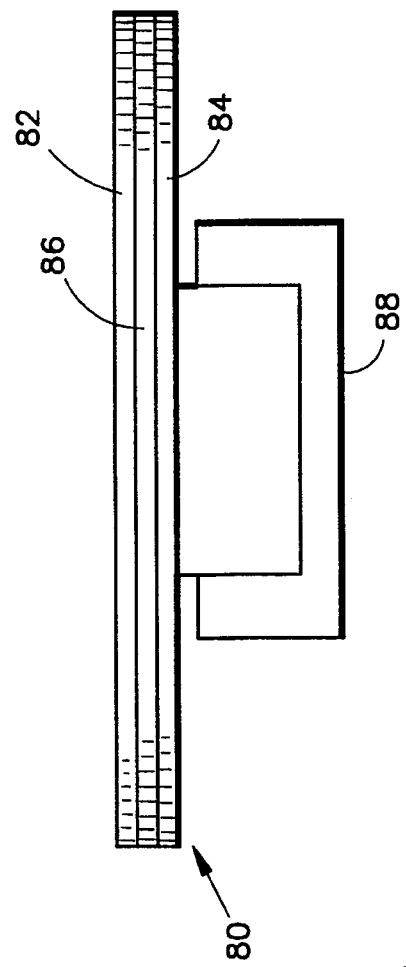
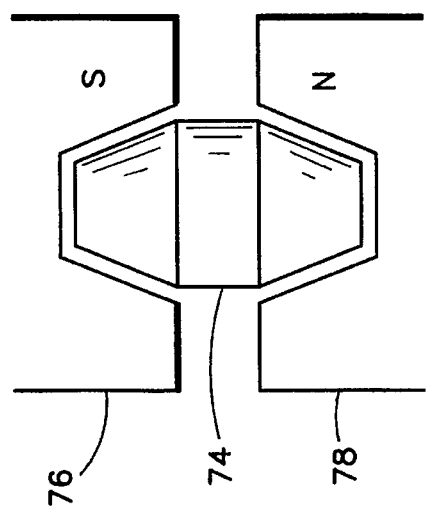
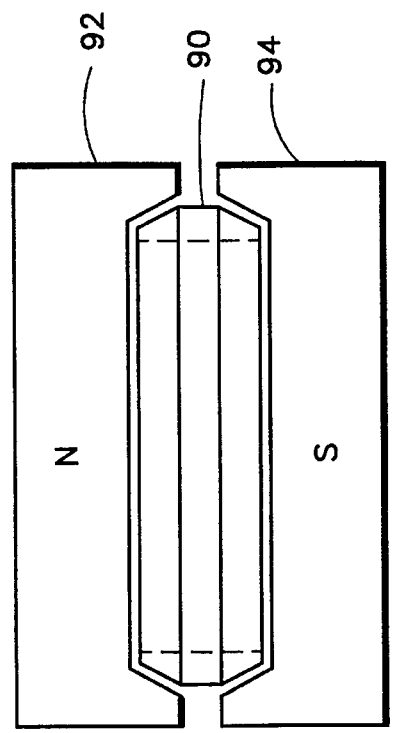

tion # 1

ANGULAR SENSING SYSTEM

BACKGROUND OF THE INVENTION

1. Field of the Invention

The present invention relates to angular sensing and more particularly to the use of numerical control robotics for performing high precision tasks.

2. Description of the Related Art

The cost of operations and maintenance of remote or inaccessible systems can be reduced if robotics is used to accomplish tasks currently being done by humans on site or with telerobotics. The combining of numerical control robotic techniques, such as those used to assemble cars and other products with autonomous rovers, which can be accurately positioned, has the potential to provide this capability. Heretofore, this has not been accomplished due to insufficient reproducibility of motions. As will be disclosed below, the present invention supplies angular information in the submicroradian range and reduces positioning errors to a level which enables the combining of these two technologies.

SUMMARY OF THE INVENTION

The present invention is an angular sensing system. In its broad aspects, a rotatable member is positioned coaxial with a joint between a first element and a second element. The joint defines an angle to be measured. The rotatable member has coded information thereon. First and second sensing heads are attached to respective elements. Coded information is arranged on the rotatable member so as to periodically pass in readable proximity to the sensing heads once every revolution of the rotatable member. A decoding system is provided for each sensing head. Each decoding system includes threshold circuitry, a state machine, and a pulse generator for providing a timing strobe. A first timer uses a timing strobe from the first sensing head for continuously determining the average elapsed time for one complete revolution of the rotatable member. A second timer uses timing strobes from the first and second sensing heads to continuously determine the average elapsed time for the coded information on the rotatable member to travel from the first sensing head to the second head. A time-based generator provides the necessary time pulse references to the first and second timers. Ratio determining circuitry calculates the ratio of the average elapsed time of the second timer to the average elapsed time of the first timer. The ratio defines the angle between the first element and second element as a fraction of a revolution.

The present invention measures angles very accurately at a low cost. The rotatable member may comprise, for example, a disk, cylinder, spindle or ring which is capable of spinning coaxially with the joint whose limb angle is to be measured. The angle between the elements or limbs are obtained by dividing the time it takes for a unique pattern to traverse the angle by the time it takes to complete one revolution. The present system is capable of measuring angular deviations less than five microradients or one second of arc, using inexpensive materials such as mylar coated with magnetic media, such as which currently exists in magnetic tape, floppy disk related technology. Metal coated plastics which have been developed for compact disc (CD) technology may alternately be implemented for use with the present system. These more advanced materials are capable of yielding resolutions of less than 0.1 arc seconds.

Other objects, advantages and novel features of the present invention will become apparent from the following detailed description of the invention when considered in conjunction with the accompanying drawings.

BRIEF DESCRIPTION OF THE DRAWINGS

FIG. 5 is a cross-sectional view of an embodiment of the present invention in which the rotatable member consists of a diamagnetic spindle in a magnetic field.

FIG. 6 is a cross-sectional view of another embodiment in which the rotatable member consists of a composite of metallic disks, one of which is coated with magnetic material, which uses a lightweight vibration damping material to separate the metallic disks. The resulting composite is associated with a drive system.

FIG. 7 illustrates a rotatable member, which comprises a ring of diamagnetic material.

The same elements or parts throughout the figures are designated by the same reference characters.

DETAILED DESCRIPTION OF THE PREFERRED EMBODIMENT

Figure 1:
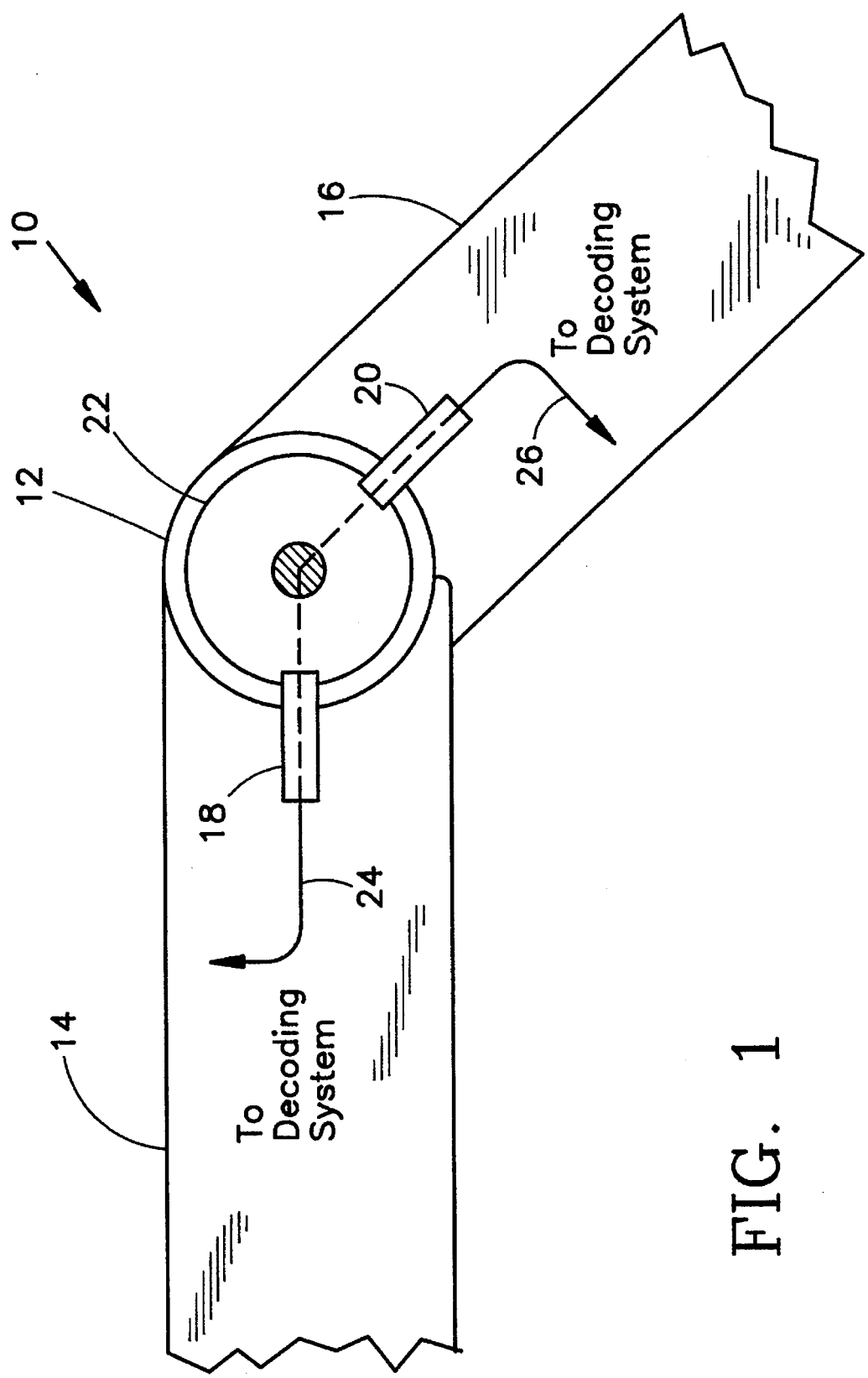
FIG. 1 is a schematic illustration of the present system showing portions of first and second robotic limbs and a joint therebetween.

Referring now to the drawings and the characters of reference marked thereon, a preferred embodiment of the present invention is illustrated, designated generally as 10. A rotatable member 12 is assembled in a joint between a first element or limb 14 and a second element or limb 16 of a robotic arm. The axis of rotation of the rotatable member 12 coincides with the axis of rotation of the joint. The joint defines the angle to be measured by the present angular sensing system 10. The rotatable member, in this FIG. 1 embodiment, comprises a metallic disk coated with material which can record magnetic marks, which can be sensed by a first sensing head 18 attached to the first element 14 and a second sensing head 20, which is attached to the second element 16. The coded information is arranged on the rotatable member or disk 12 so as to periodically pass in readable proximity to the sensing heads 18, 20 once every revolution of the member 12.

The joint depicted in FIG. 1 represents one of what may be many articulated joints in a robotic arm. The information is arranged in a circular track 22 that is read by both sensing heads 18, 20. The sensing heads 18, 20 are connected to a decoding system (described in detail below) by appropriate connections 24, 26. Such connections may comprise, for example, electrical wiring or fiber optics.

Figure 2:
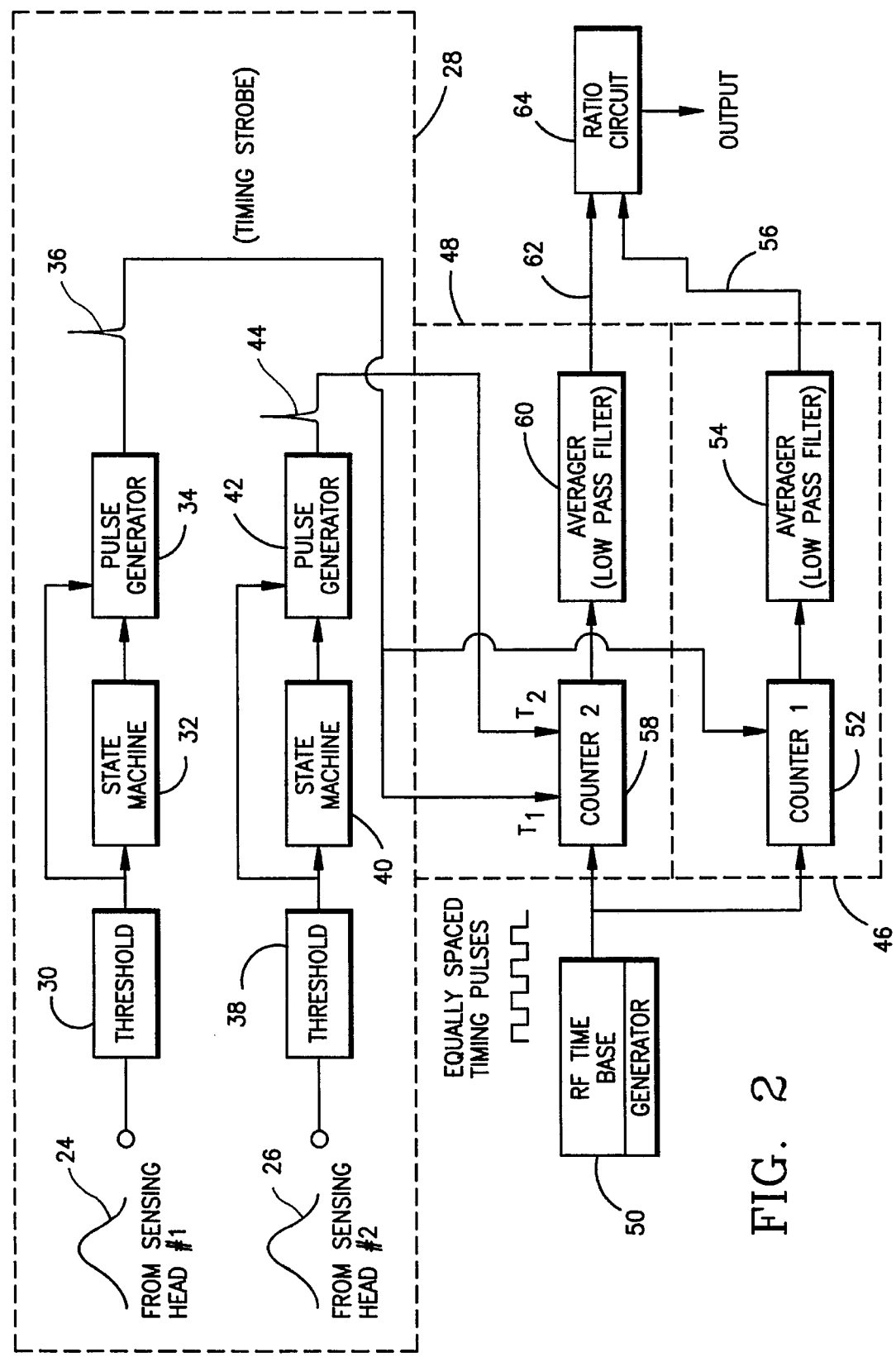
FIG. 2 is a block diagram of the decoding system, first timer, second timer, time based generator, and the ratio determining circuitry of the present invention.

Referring now to FIG. 2, the decoding system of the present invention is illustrated, designated by phantom lines 28. The signal 24 from the first sensing head 18 comprises a stream of pulses, which is introduced into threshold circuitry 30, which converts pulses into an asynchronous bit stream. A state machine 32 recognizes the unique coded information within the bit stream for the purpose of anticipating a timing pulse as the next bit emanating from the sensing head 18. A pulse generator 34 is enabled by the state machine 32 for outputting a timing strobe 36 in response to the next bit emanating-from the threshold circuitry 30. An equivalent process occurs for signal 26 from sensing head 20, as designated by numerals 38, 40, 42 and 44. The timing strobes 36, 44 represent very short duration pulses, which contain timing information related to the angle between the elements of the joint.

A first timer, designated by phantom lines 46 uses the timing strobe 36 from the first sensing head 18 to continuously determine the average elapsed time for one complete revolution of the rotatable member 12. A second timer, designated by phantom line 48, uses the timing strobes 36 and 44 from both the first and second sensing heads 18, 20 to continuously determine the average elapsed time for the coded information on the rotatable member 12 to travel from the first sensing head 18 to the second sensing head 20. A time-based generator 50 provides time pulse references to the first and second timers 46, 48.

A counter 52 utilizes the time-based reference and timing strobe 36 to determine the time for a revolution of the rotatable member as follows: The arrival of the strobe 36 causes the counter to start counting the time-based pulses. The arrival of the next strobe 36 causes the timer to output its count to an averaging circuit 54 and then resume the count at zero. The averaging circuit 54 is a low pass filter, which removes noise from the timing signal in order to provide an average time representing the period of revolution of the rotatable member. Output data 56 represents the elapsed time for a revolution.

The second timer 48 utilizes a counter 58 and averager 60 to determine the average time by starting a count upon receipt of each timing strobe from the first sensing head 18. The count is output to an averaging circuit 60, reset to zero, and stopped upon receipt of each timing strobe from the second sensing head 20. The output 62 represents the elapsed time between the passage of the timing mark from the first sensing head 18 to the second sensing head 20. Ratio determining circuitry 64 calculates the ratio of the average elapsed time of the second timer 48 to the average elapsed time of the first timer 46. The ratio defines the angle between the first element 14 and the second element 16 as a fraction of a revolution.

The state machines 32, 40 utilize the internal states, internal time delays and the bit stream emanating from the threshold circuitry to identify unique temporal spacings of bits to locate the timing bit in the track. Once this unique sequence has been located, the state machine enables the pulse generators 34, 42 so that they can output their timing strokes based upon the arrival of the next bit. The state machines can be implemented so that the bit stream provides the signals to change states or reset states without clock logic in an asynchronous fashion or with clocked logic circuits in a synchronous fashion.

Figure 3:
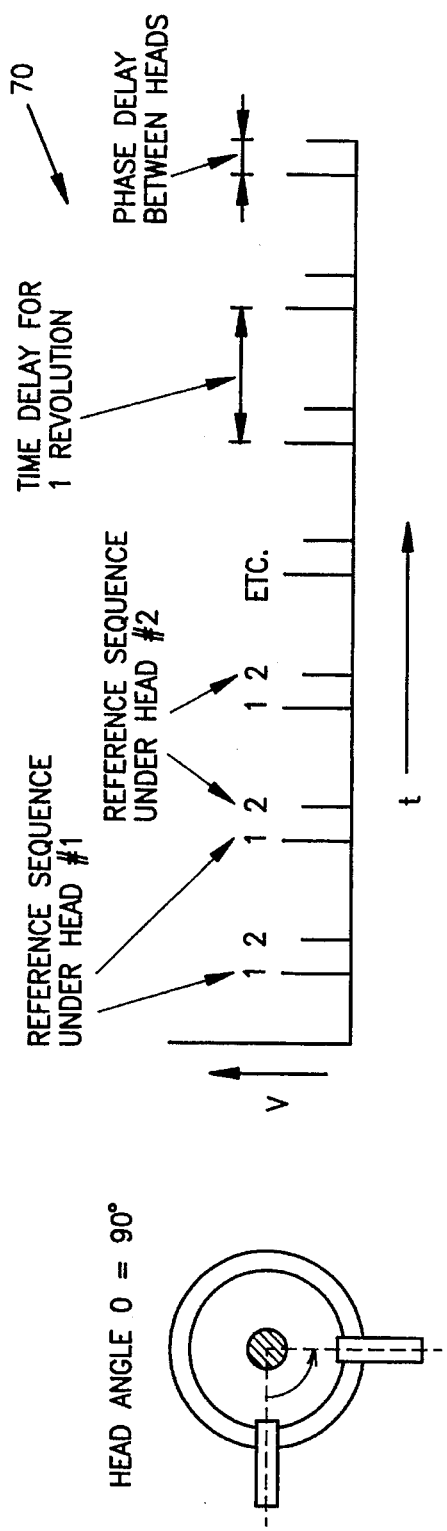
FIG. 3 illustrates sensing heads positioned at a relative angle of 90° and the timing signals generated from the bit streams emanating therefrom.

Referring now to FIG. 3, the head angle is illustrated at 90° and the corresponding sequence of timing strokes is shown, designated generally as 70. The voltages of the timing strobes from the first sensing and second sensing heads are plotted versus time. The time interval between the strobes generated by the first sensing head represents the time interval required for one revolution of the rotating member. Equally, the time intervals between the strobes generated by the second sensing head also represent the time interval for one complete revolution of the rotating member.

The positioning of the timing strobes from the second head in relation to the timing strobes from the first head, on either side, represents the angle. As shown in FIG. 3, the distance between strobe 1 and strobe 2 is equal to one quarter the distance between strobe 1 and the next strobe 1, indicating one quarter of a cycle or revolution. This corresponds to 90°.

Figure 4:
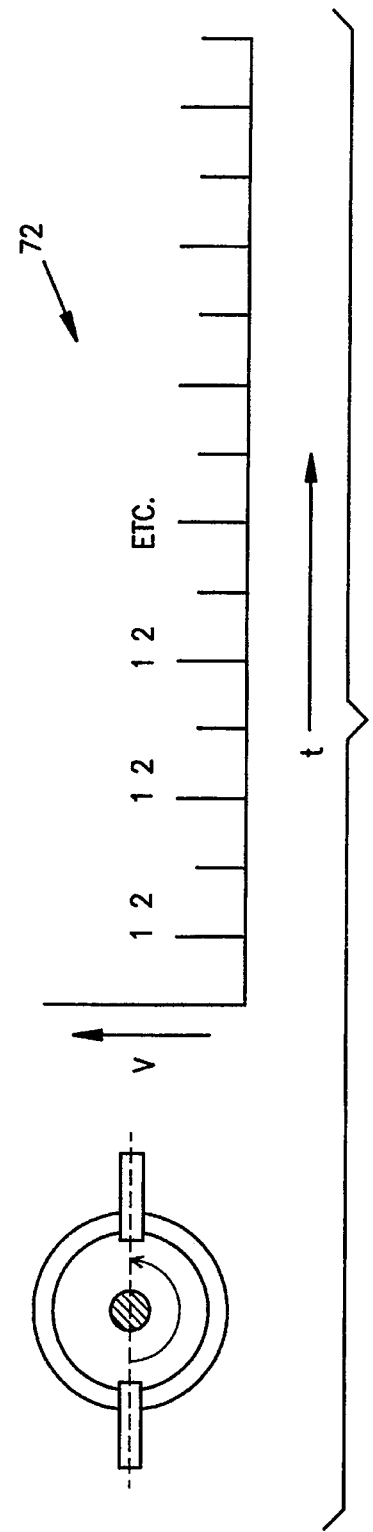
FIG. 4 shows the sensing heads positioned at a relative angle of 180° and the timing strobes generated from the bit stream emanating therefrom.

FIG. 4 illustrates a head angle at 180°. The plot of voltage versus time is designated generally as 72. For such a 180° joint angle, the strobe from head number 2 is positioned midway between the strobes from head number 1.

Referring now to FIG. 5, an alternate member rotatable is illustrated which comprises a spindle, designated 74. The spindle is formed of magnetic material, which is suspended in a magnetic field provided by magnetic poles designated 76, 78. The spindle has a substantially smooth outer surface which contains marks, which can be optically sensed by the sensing heads. The magnetic material is preferably a diamagnetic material or a ferro magnetic material. If a diamagnetic spindle is utilized and levitated between magnetic poles in a vacuum, there will be virtually no friction. Such a device has applications for space vehicles, space stations or/and robotics operating in a vacuum environment. This system can be spun up using small quantities of dry air. A suitable diamagnetic material is pyrolytic graphite. In the case where a ferro magnetic material is used, an electromagnet and position sensing sensor are required in order to control the position of the ferro magnetic spindle in the magnetic pole pieces.

Referring now to FIG. 6, another embodiment of the rotatable member is illustrated, designated generally as 80. In this embodiment, layers 82, 84 comprising metallic disks are interleaved with lightweight vibration damping material 86. Damping material 86 damps oscillations in the disk, which might otherwise cause errors in the angular determination. A drive system 88 spins the disk 82, 84, 86 at a substantially constant angular velocity.

FIG. 7 illustrates yet another embodiment of the rotatable member. In this instance, the rotatable member comprises a ring 90. The ring 90 is suspended between magnetic pole pieces 92, 94. This operates in a similar manner as the FIG. 5 embodiment. The ring 90, due to a relatively large diameter, provides for more precise angular determination than the spindle.

The present invention is particularly useful to measure angles which are static or are changing slowly. A particular projected use is for mobile robots, which can move from place to place and register themselves via pin insertion or other techniques with respect to a unit of equipment which requires maintenance or assembly. The unit would then inspect, remove, or replace equipment modules. This type of capability will be required, for example, to operate an advanced industrial facility on the moon at a reasonable cost. The technology can also be used to eliminate maintenance extravehicular activity (EVA) requirements on the Space Station, with resultant cost reductions, and is directly applicable to earth based robotic applications.

The ability to make factory numerical control robots mobile, while simultaneously increasing their accuracy allows one unit to perform multiple non-concurrent tasks that were previously done by people or under-utilized stationary robots. The semi-autonomous units utilizing this technology alert a teleoperator only if problems are detected. Image processing requirements are substantially eliminated by the increased precision of the units.

Obviously, many modifications and variations of the present invention are possible in light of the above teachings. It is, therefore, to be understood that, within the scope of the appended claims, the invention may be practiced otherwise than as specifically described.

What is claimed and desired to be secured by Letters Patent of the United States is:

1. An angular sensing system, comprising:
   a) a rotatable member coaxial with a joint between a first element and a second element, said joint defining an angle to be measured, said rotatable member having coded information thereon;
   b) a first sensing head attached to said first element;
   c) a second sensing head attached to said second element, said coded information being arranged on said rotatable member so as to periodically pass in readable proximity to said sensing heads once every revolution of said rotatable member; and,
   d) a decoding system for each said sensing head, comprising:
      i) threshold circuitry for converting pulses from its respective sensing head into an asynchronous bit stream;
      ii) a state machine for recognizing unique coded information within said bit stream for the purpose of anticipating a timing pulse as the next bit emanating from its respective sensing head; and,
      iii) a pulse generator enabled by said state machine for outputting a timing strobe in response to said next bit emanating from said threshold circuitry;
   e) a first timer which uses said timing strobe from said first sensing head to continuously determine the average elapsed time for one complete revolution of said rotatable member;
   f) a second timer which uses said timing strobes from said first and second sensing heads to continuously determine the average elapsed time for said coded information on said rotatable member to travel from said first sensing head to said second sensing head; and,
   g) a time-based generator for providing time pulse references to said first and second timers;
   h) ratio determining circuitry for calculating the ratio of said average elapsed time of said second timer to said average elapsed time of said first timer, said ratio defining the angle between said first element and said second element as a fraction of a revolution.

2. The angular sensing system of claim 1, wherein said first timer continuously determines the average elapsed time by the steps of:

a) initiating a count at zero based on the arrival of said timing strobe;
   b) outputting said count to an averaging circuit upon arrival of the next strobe; and,
   c) resetting and resuming its count.

3. The angular sensing system of claim 1, wherein said second timer continuously determines the average elapsed time by the steps of:
   a) starting a count upon receipt of each timing strobe from said first sensing head; and,
   b) outputting said count to an averaging circuit, resetting to zero, and stopping upon receipt of each timing strobe from said second sensing head.

4. The angular sensing system of claim 1, wherein said rotatable member comprises a metallic disk coded with material which can record magnetic marks which can be sensed by said sensing heads.

5. The angular sensing system of claim 1, wherein said rotatable member comprises a disk with a substantially smooth surface containing marks which can be optically sensed by said sensing heads.

6. The angular sensing system of claim 1, wherein said rotatable member comprises a spindle formed of diamagnetic material with a substantially smooth surface containing marks which can be optically sensed by said sensing heads and which is suspended in a magnetic field.

7. The angular sensing system of claim 1, wherein said rotatable member comprises a ring formed of diamagnetic material with a substantially smooth surface containing marks which can be optically sensed by said sensing heads and which is suspended in a magnetic field.

8. The angular sensing system of claim 1, wherein said rotatable member comprises a spindle formed of ferromagnetic material with a substantially smooth surface containing marks which can be optically sensed by said sensing heads and which is suspended in a magnetic field.

9. The angular sensing system of claim 1, wherein said state machine comprises clocked logic circuits which operate synchronously with a system clock.

10. The angular sensing system of claim 1, wherein said state machine operates asynchronously in response to said bit stream emanating from said threshold circuitry.

11. The angular sensing system of claim 1, wherein said rotatable member comprises a plurality of layers interleaved with lightweight vibration damping material.

* * * * *